United States Patent [19]

Nicholas

[11] Patent Number: 4,904,930
[45] Date of Patent: Feb. 27, 1990

[54] METHOD OF CARRIER FREQUENCY ESTIMATION

[75] Inventor: David C. Nicholas, Cedar Rapids, Iowa

[73] Assignee: Rockwell International Corporation, El Segundo, Calif.

[21] Appl. No.: 245,478

[22] Filed: Sep. 16, 1988

[51] Int. Cl.$^4$ ............................................. G01R 23/16
[52] U.S. Cl. .................................................. 324/77 E
[58] Field of Search ................. 324/77 E, 77 G, 78 Z, 324/79 D; 364/484, 485; 375/96, 97, 99

[56] References Cited

U.S. PATENT DOCUMENTS

| | | | |
|---|---|---|---|
| 4,627,079 | 12/1986 | von der Embse | 324/77 E |
| 4,665,494 | 5/1987 | Tanaka | 364/485 |
| 4,777,605 | 10/1988 | Pilkington | 364/484 |

OTHER PUBLICATIONS

Brigham, Oran E., *The Fast Fourier Transform*, pp. 167–169 (Prentice-Hall 1974).

*Primary Examiner*—John Chapman
*Assistant Examiner*—Louis M. Arana
*Attorney, Agent, or Firm*—John C. McFarren; M. Lee Murrah; H. Fredrick Hamann

[57] ABSTRACT

A method is provided for searching a wide, high-noise frequency band for a narrow, phase-modulated signal to determine the approximate carrier frequency of a data signal. The method comprises the steps of sampling a received signal at a rate sufficiently high to cover the search bandwidth, performing an efficient Fourier transform on the sampled signal to obtain a discrete point power spectral density, filtering each frequency component of the power spectral density with averaging filters, analyzing the filtered components to find the area of greatest power concentration, and computing the center frequency of the area of greatest power concentration. The method determines the approximate carrier frequency of a data signal quickly and efficiently for use in starting or detecting loss of lock in a frequency-locked demodulator.

8 Claims, 1 Drawing Sheet

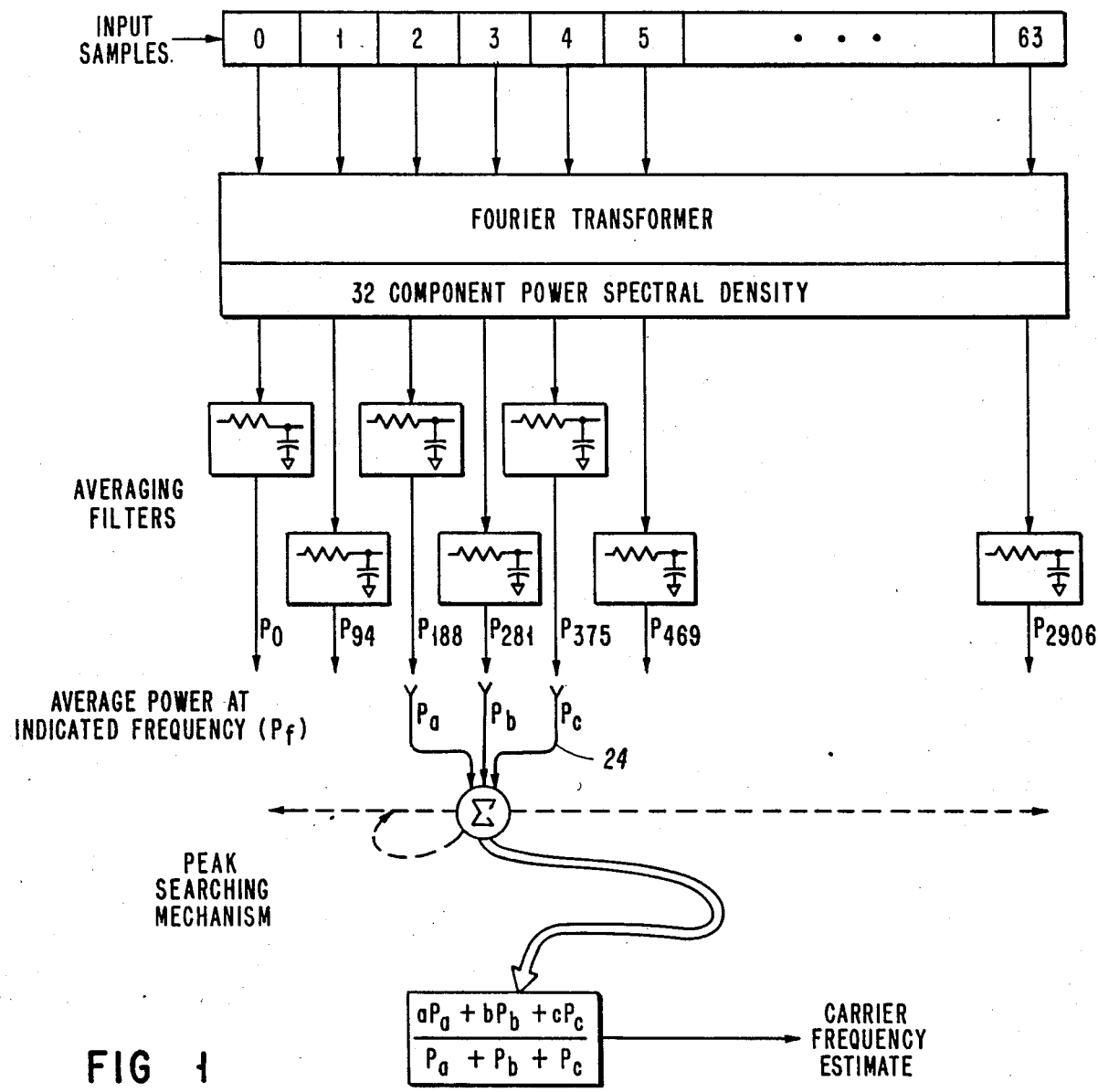
FIG 1
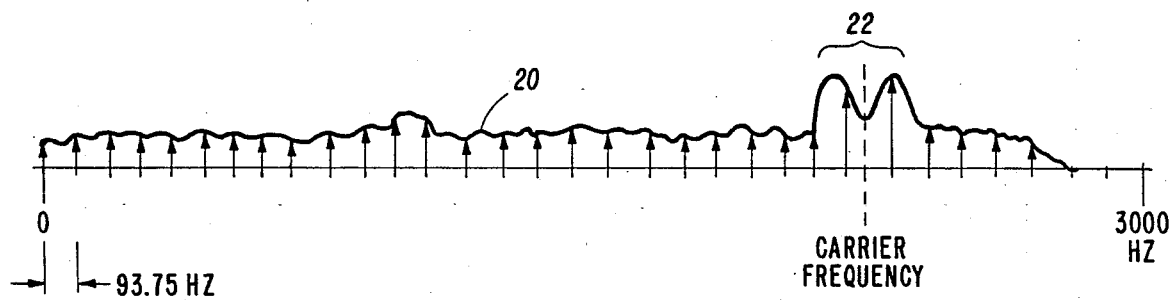
FIG 2
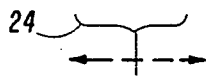

METHOD OF CARRIER FREQUENCY ESTIMATION

TECHNICAL FIELD

The present invention relates to demodulation of phase-modulated data signals and, in particular, to a method of searching a wide, high-noise frequency band for a narrow, phase-modulated data signal to determine the approximate carrier frequency.

BACKGROUND OF THE INVENTION

In certain data communications systems, demodulation of received data signals is hindered by data carrier frequency uncertainty. For example, in mobile satellite communications systems the land mobile demodulators must be able to lock on to intermittent data signals masked by high levels of noise. In such systems, carrier frequency changes due to oscillator drift or to Doppler shift from user movements can be a significant fraction of the data rate. Thus, it is an important characteristic of a demodulator in the land mobile satellite system to be able to identify and to lock on to the data carrier frequency in the presence of high noise, shadowing, multipath fading, oscillator drift, and Doppler shift.

Another problem confronting a land mobile demodulator in a satellite communications system is that the phase modulated data signal appears as a double peak amid the background noise with the actual carrier frequency falling between the peaks. In prior art systems that use fine grain transforms to find the data signal, one or the other of the double peaks can be selected as the carrier frequency rather than the actual carrier frequency that falls between the peaks.

It is also known in the prior art that the double peaks of the data signal can be eliminated by squaring the signal. Squaring results in a single peaked signal that can be analyzed using the fine grain transform described above. However, squaring the signal doubles the frequency and the bandwidth and increases the noise. Furthermore, squaring the signal requires a higher sampling rate along with the inherent computational difficulties of dealing with the doubled bandwidth.

Thus, there is a need for a method of finding and approximating the carrier frequency of a data signal having a very low signal-to-noise ratio in a wide search bandwidth. Furthermore, it is desirable that the method provide the approximate carrier frequency rapidly and in a computationally efficient manner. Determining the approximate carrier frequency is important as the first step in narrowing the bandwidth to provide a higher signal-to-noise ratio and to provide a starting frequency for a frequency-locked loop in a demodulator.

SUMMARY OF THE INVENTION

The present invention is a method for quickly and efficiently searching a wide, high-noise frequency band for a narrow, phase-modulated data signal to generate an estimate of the carrier frequency. The carrier frequency estimate is then provided to a frequency-locked demodulator such as used in a land mobile satellite communications system. In these systems, the demodulator must be set to an initial carrier frequency that differs from the actual carrier frequency by no more than one-fourth of the data rate in order to correctly pull in and lock on to the actual carrier frequency.

The method of the present invention includes sampling a received signal at a rate sufficiently high to represent a search bandwidth containing a data signal. A sequence of Fast Fourier Transforms (FFTs) is then performed on the sampled signal as efficiently and coarsely as possible. Each transform ultimately yields a power spectral density (PSD) of discrete points. Corresponding PSD components are then filtered in time. The transformed and filtered signal is analyzed by moving a narrow window across the search bandwidth to determine the general area containing the signal amid the noise. The carrier frequency estimate is then generated by determining the "center of gravity" of the windowed area containing the signal. This method is fast, computationally efficient, capable of estimating the carrier frequency within 40 Hz of the actual frequency, and highly reliable for 200 bit-per-second biphase modulated data signals having a carrier frequency uncertainty of several thousand Hertz.

BRIEF DESCRIPTION OF THE DRAWINGS

For a more complete understanding of the present invention and for further advantages thereof, reference is made to the following Description of the Preferred Embodiment taken in conjunction with the accompanying Drawings, in which:

FIG. 1 is a block diagram illustrating the basic steps of the method of the present invention; and FIG. 2 is an illustration of the data signal amid the noise in the search bandwidth of the present invention.

DESCRIPTION OF THE PREFERRED EMBODIMENT

The present invention is a method of determining, within approximately 40 Hz, the carrier frequency of a 200 bit per second, differentially phase-shift keyed (DPSK) data signal that is at an unknown carrier frequency within a 3000 Hz bandwidth of a demodulator of a mobile satellite communications system. Determining the carrier frequency is important in a land mobile satellite system because the received signal is subject to fading, drift, and Doppler shift caused by movement of the mobile units. Because the downstream frequency-locked demodulator can acquire a false lock, the present invention continuously outputs an estimate of the carrier frequency to the demodulator. The demodulator then narrows the carrier frequency estimate down to a few Hertz, unless the initial estimate is too far off. In the preferred embodiment, a frequency discrepancy between the demodulator and the initial carrier frequency estimate of more than 50 Hz for more than 20 trials causes the demodulator to be reset to the current frequency estimate to give it a new starting point for lock on.

The present invention provides a method for quickly and efficiently searching over a wide, high-noise frequency band for a narrow, phase-modulated signal to determine the approximate carrier frequency. The method of the present invention is illustrated in block diagram form in FIG. 1. The first step of the method is to sample the received signal at a rate sufficiently high to cover the search bandwidth and locate the data signal. In the preferred embodiment, the nominal carrier frequency is 1200 Hz, but it can vary between 600 and 1800 Hz. The data rate is 200 bits per second, and most of the power is in a data bandwidth of 200 Hz. The signal is sampled at the rate of 6000 samples per second.

Each carrier frequency estimate uses 64 samples covering the frequency range of 0 to 3000 Hz. Fourier transforms performed on the samples result in a discrete 32 point power spectral density (PSD) with coarse results spaced every 93.75 Hz from 0 to 2906.25 Hz. This coarse transform reduces the computation load, but the carrier frequency cannot be determined within the desired 40 Hz range simply by picking the largest component because the signal, within its 200 Hz bandwidth, is oddly shaped and different from sample set to sample set as a result of the data that it carries. In the preferred embodiment, the Fourier transforms are performed repeatedly on sets of 64 samples. Even better results can be obtained, although less efficiently, if sufficient computational power is available to overlap the sets of 64 samples.

In the preferred embodiment, the Fast Fourier Transform (FFT) technique is used. When only a real signal is available (as opposed to a complex signal with both real and imaginary components), the best method of performing the 64 point real FFT is to utilize a standard 32 point complex FFT both preceded and followed by additional transforms. This technique is described by Oran E. Brigham in *The Fast Fourier Transform*, pp. 167-169, Prentice-Hall, Inc. (1974). Although other Fourier transform techniques can be used, the FFT technique provides the most efficient overall method of computation.

The FFT technique as used in the present invention results in a 32 point complex representation. Each of the 32 frequencies is characterized by a complex number having both real and imaginary parts representing, respectively, the amplitude of the cosine and sine components at each frequency. The 32 point PSD is the sum of the squares of the real and imaginary components at each frequency.

In the next step, the 32 point PSD estimates are filtered in time by a bank of 32 one-pole resistor/capacitor averaging filters, or their digital equivalent, which provide an exponentially weighted average. Alternatively, some type of multipoint weighted moving average can be used. Filtering is necessary because the individual 64 sample transforms of the signal typically do not exhibit the nominal, symmetrical "double-humped" spectrum every time because of the randomly modulated data. However, the filtered signal is more likely to look like the nominal signal. Furthermore, there is little actual power at the center of the double-humped signal, the determination of which is the objective, and the signal does not necessarily align with the component center frequencies of the Fast Fourier Transform.

The next step in the method is to determine the area of greatest power concentration in the search bandwidth. This is accomplished by moving a narrow window across the filtered signal to find the general area of signal concentration. This step is necessary because of the low signal-to-noise ratio of the data signal. As illustrated in FIG. 2, the amplitude of the noise envelope 20 is a significant fraction of the data signal 22. The 32 components are shown spaced at 93.75 Hz intervals across the entire 3000 Hz search bandwidth. A narrow, moving window 24 is moved across the entire 3000 Hz bandwidth to find the general area of signal concentration. At each of the 32 component points, the power associated with that frequency is illustrated as a vertical vector. In the preferred embodiment, window 24 has a length of three of the 32 components. Other window lengths of window 24 can be used, but experimental results indicate that a window length of three components minimizes the maximum error that occurs as the carrier frequency assumes various random alignments with respect to the positions of the power components.

Referring again to FIG. 1, window 24 is shown as moving across the search bandwidth to analyze groups of three components to locate the area of greatest power of concentration. In FIG. 1, three windowed components of the 32 component spectrum are indicated as frequencies a, b, and c each having an average power represented by $P_a$, $P_b$, and $P_c$, respectively.

After the three component area of greatest power concentration has been located, the frequency of the power concentration is determined by the "center of gravity" expression:

$$\frac{aP_a + bP_b + cP_c}{P_a + P_b + P_c}.$$

This calculation provides an estimation of the carrier frequency of the typically "double-humped" signal 22 illustrated in FIG. 2.

As stated above, the method of the present invention provides a better estimate of the carrier frequency than by simply using a fine grain transform to find a peak. Using a fine grain transform would result in selecting one or the other of the double peaks of the signal 22 illustrated in FIG. 2 instead of determining the carrier frequency that generally falls between the peaks.

Although the present invention has been described with respect to a specific embodiment thereof, various changes and modifications may be suggested to one skilled in the art, and it is intended that the present invention encompass such changes and modifications as fall within the scope of the appended claims.

I claim:

1. A method of estimating the unknown frequency of a carrier contained in a received data signal within a search bandwidth, comprising the steps of:
    taking a multiplicity of time domain samples of the data signal;
    performing a single Fast Fourier Transform on said samples to obtain a plurality of power spectral density components at discrete points across the search bandwidth;
    moving a search window encompassing a plurality of the power spectral density components across said search bandwidth to determine an area of greatest power concentration; and
    computing a weighted average frequency from the plurality of power spectral density components in the area of greatest power concentration, said frequency being said estimated carrier frequency of said data signal.

2. The method of claim 1 wherein said components encompassed in said search window comprise three in number.

3. The method of claim 2 wherein said computing step is performed in accordance with the following formula:

$$\frac{aP_a + bP_b + cP_c}{P_a + P_b + P_c}$$

where:
    Pa, Pb, Pc = power spectral density components
    a, b, c = frequencies of components 4. The method of claim 1 further comprising the step of filtering said power spectral density components.

5. The method of claim 4 wherein filtering step comprises averaging said components to obtain an average power at each sampled frequency.

6. A method of estimating the unknown frequency of a carrier contained in a received data signal within a search bandwidth, comprising the steps of:
taking a multiplicity of time domain samples of the data signal;
performing a single Fast Fourier Transform on said samples to obtain a plurality of power spectral density components at discrete points across the search bandwidth;
filtering said power spectral density components;
moving a search window encompassing three power spectral density components across said search bandwidth to determine an area of greatest power concentration; and
computing a weighted average frequency from the plurality of power spectral density components in the area of greatest power concentration in accordance with the following formula:

$$\frac{aPa + bPb + cPc}{Pa + Pb + Pc}$$

where:
Pa, Pb, Pc = power spectral density components
a, b, c = frequencies of components said frequency being said estimated carrier frequency of said data signal.

7. A method of estimating an uncertain data signal carrier frequency in a search bandwidth, comprising the steps of:
obtaining a plurality of samples at predetermined intervals;
performing transforms on said samples to generate power spectral density components at discrete points across the search bandwidth;
filtering said components with averaging filters;
moving a search window across said filtered components to locate an area of greatest power concentration;
computing a center frequency of the area of greatest power concentration to estimate the carrier frequency;
monitoring frequency lock of a frequency-locked demodulator by comparing the carrier frequency estimate with a current demodulator frequency to obtain a difference frequency; and
indicating a loss of lock if said difference frequency exceeds a predetermined value for a predetermined time.

8. The method of claim 7 further comprising the step of resetting said current demodulator frequency estimate upon indication of loss of lock.

* * * * *